(12) United States Patent
Mizuno et al.

(10) Patent No.: US 6,384,396 B1
(45) Date of Patent: May 7, 2002

(54) SOLID-STATE IMAGE SENSING DEVICE AND SOLID-STATE IMAGE SENSING DEVICE ARRAY

(75) Inventors: Seiichiro Mizuno; Hiroo Yamamoto; Harumichi Mori, all of Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 8 days.

(21) Appl. No.: 09/625,953

(22) Filed: Jul. 26, 2000

Related U.S. Application Data (63) Continuation-in-part of application No. PCT/JP99/03856, filed on Jul. 16, 1999.

(30) Foreign Application Priority Data

Oct. 30, 1998 (JP) ............................................ 10-310704

(51) Int. Cl.[7] ................................................ H04N 3/14
(52) U.S. Cl. .................................... 250/208.1; 348/302
(58) Field of Search .......................... 250/208.1, 214 A; 348/241, 294, 298, 300, 302, 303, 304, 305, 306, 308, 311, 319, 320, 322, 324

(56) References Cited

U.S. PATENT DOCUMENTS

| | | | |
|---|---|---|---|
| 4,316,221 A | * | 2/1982 | Swab .......................... 348/306 |
| 4,660,089 A | | 4/1987 | Lee |
| 4,914,504 A | | 4/1990 | Rosan |
| 4,942,474 A | * | 7/1990 | Akimoto et al. ............. 348/301 |

FOREIGN PATENT DOCUMENTS

| | | |
|---|---|---|
| JP | 61-253859 | 11/1986 |
| JP | 63-257267 | 10/1988 |
| JP | 3-027684 | 2/1991 |
| JP | 6-260630 | 9/1994 |
| JP | 8-181821 | 7/1996 |
| JP | 9-326479 | 12/1997 |
| JP | 10-012851 | 1/1998 |

OTHER PUBLICATIONS

Supplementary European Search Report for Application No. EP 99 92 9880, dated Oct. 16, 2000 (citing the five references listed above).

* cited by examiner

Primary Examiner—Stephone Allen
(74) Attorney, Agent, or Firm—Morgan, Lewis & Bockius LLP (57) ABSTRACT

A solid-state image sensing device 10 mainly includes a light-receiving portion 14 formed on a substrate 12, a vertical shift register 16 formed to face one side of the light-receiving portion 14, and a horizontal shift register 18 and charge amplifiers 20 formed to face the opposite side of the light-receiving portion 14. The light-receiving portion 14 is formed from M×N photodiodes 22, and each photodiode 22 has a gate switch 24. The control terminals of the gate switches 24 are connected to the vertical shift register 16 via gate lines 26 in units of rows. The gate lines 26 have compensation lines 26c so as to make almost equal the capacitances of the gate lines 26 connected in units of rows. Accordingly, a plurality of solid-state image sensing devices 10 can be easily arrayed without any dead zone and can increase the light-receiving area.

5 Claims, 6 Drawing Sheets

SOLID-STATE IMAGE SENSING DEVICE AND SOLID-STATE IMAGE SENSING DEVICE ARRAY

RELATED APPLICATION

This is a continuation-in-part application of application Ser. No. PCT/JP99/03856 filed on Jul. 16, 1999, now pending.

BACKGROUND OF THE INVENTION

1. Field of the Invention

The present invention relates to a solid-state image sensing device and solid-state image sensing device array and, more particularly, to an X-Y address type solid-state image sensing element of sequentially reading out signals from respective photoelectric converters on the basis of vertical and horizontal scanning signals.

2. Related Background Art

As the image processing speed increases with the recent advance of information processing apparatuses, the need arises for a larger light-receiving area of an image sensor. To meet this need, a light-receiving element itself may be made large by combining amorphous Si and TFTs. However, considering image lag, the light-receiving area is practically increased by arraying a plurality of X-Y address type solid-state image sensing devices such as MOS image sensors.

The X-Y address type solid-state image sensing device has a light-receiving portion constituted by forming a plurality of photoelectric converters into an M×N array (M and N are natural numbers). A vertical shift register for designating a row having a photoelectric converter from which charges are to be read out is formed on one side of the light-receiving portion. A horizontal shift register for designating a column having a photoelectric converter from which charges are to be read out is formed on a side adjacent to the side on which the vertical shift register is formed. When the light-receiving area is increased by arraying a plurality of solid-state image sensing devices, they can be arrayed up to 2×2=4 without any dead zone (i.e., they can be surrounded by the vertical and horizontal shift registers). To array a larger number of devices, the vertical and horizontal shift registers act as a dead zone.

An example of solid-state image sensing devices capable of eliminating such dead zone and arraying a plurality of solid-state image sensing devices to increase the light-receiving area is a solid-state image sensing device disclosed in Japanese Patent Laid-Open No. 9-326479. In this solid-state image sensing device, vertical and horizontal shift registers are formed on a surface different from the surface on which a light-receiving portion is formed (more specifically, a surface perpendicular to the surface on which the light-receiving portion is formed). Even if a plurality of solid-state image sensing devices are arrayed, generation of a dead zone by the vertical and horizontal shift registers can be prevented.

SUMMARY OF THE INVENTION

Using this solid-state image sensing device, a plurality of solid-state image sensing devices can be arrayed without any dead zone. However, in this solid-state image sensing device, the vertical and horizontal shift registers are formed on a surface different from the surface on which the light-receiving portion is formed. Thus, solid-state image sensing devices are difficult to manufacture and array.

It is, therefore, an object of the present invention to provide a solid-state image sensing device capable of easily arraying a plurality of devices without any dead zone, and increasing the light-receiving area.

To achieve the above object, a solid-state image sensing device according to the present invention is characterized by comprising a light-receiving portion having a plurality of photoelectric converters arrayed in M rows and N columns on a substrate, first wiring lines formed in units of columns, a first switch group including a plurality of switches for connecting the photoelectric converters to the first wiring lines in units of columns, a vertical shift register for outputting a vertical scanning signal for opening/closing the switches forming the first switch group in units of rows, second wiring lines for connecting control terminals of the switches forming the first switch group to the vertical shift register in units of rows, a second switch group including a plurality of switches for connecting the first wiring lines to a signal output line, and a horizontal shift register for outputting a horizontal scanning signal for opening/closing the switches forming the second switch group in units of columns, wherein the vertical and horizontal shift registers are arranged on two facing sides or a predetermined side of the light-receiving portion, and the second wiring lines have compensation portions for making capacitances of the second wiring lines almost equal in units of rows.

Since the vertical and horizontal shift registers are formed on two facing sides or a predetermined side of the light-receiving portion, the solid-state image sensing device can be easily formed, and a plurality of devices can be easily arrayed, compared to a case in which vertical and horizontal shift registers are formed on a surface different from the surface on which the light-receiving portion is formed.

When the vertical and horizontal shift registers are respectively formed on two facing sides of the light-receiving portion, any number of solid-state image sensing devices can be arrayed without any dead zone, on the remaining two sides on which no vertical and horizontal shift registers are formed. When both the vertical and horizontal shift registers are formed on a predetermined side of the light-receiving portion, any number of solid-state image sensing devices can be arrayed without any dead zone, on two sides adjacent to the side on which the vertical and horizontal shift registers are formed. In addition, solid-state image sensing devices can be arrayed without any dead zone, on a side facing the side on which the vertical and horizontal shift registers are formed.

These solid-state image sensing devices can be formed into a solid-state image sensing device array in which the devices are arrayed on the above-mentioned sides without any dead zone.

Further, the second wiring lines have the compensation portions for making the capacitances of the second wiring lines almost equal in units of rows. The compensation portions can compensate for the difference between capacitances caused by the difference between the lengths of the second wiring lines in units of rows, and can make the capacitances of the second wiring lines in units of rows almost equal.

DESCRIPTION OF THE PREFERRED EMBODIMENTS

Figure 1:
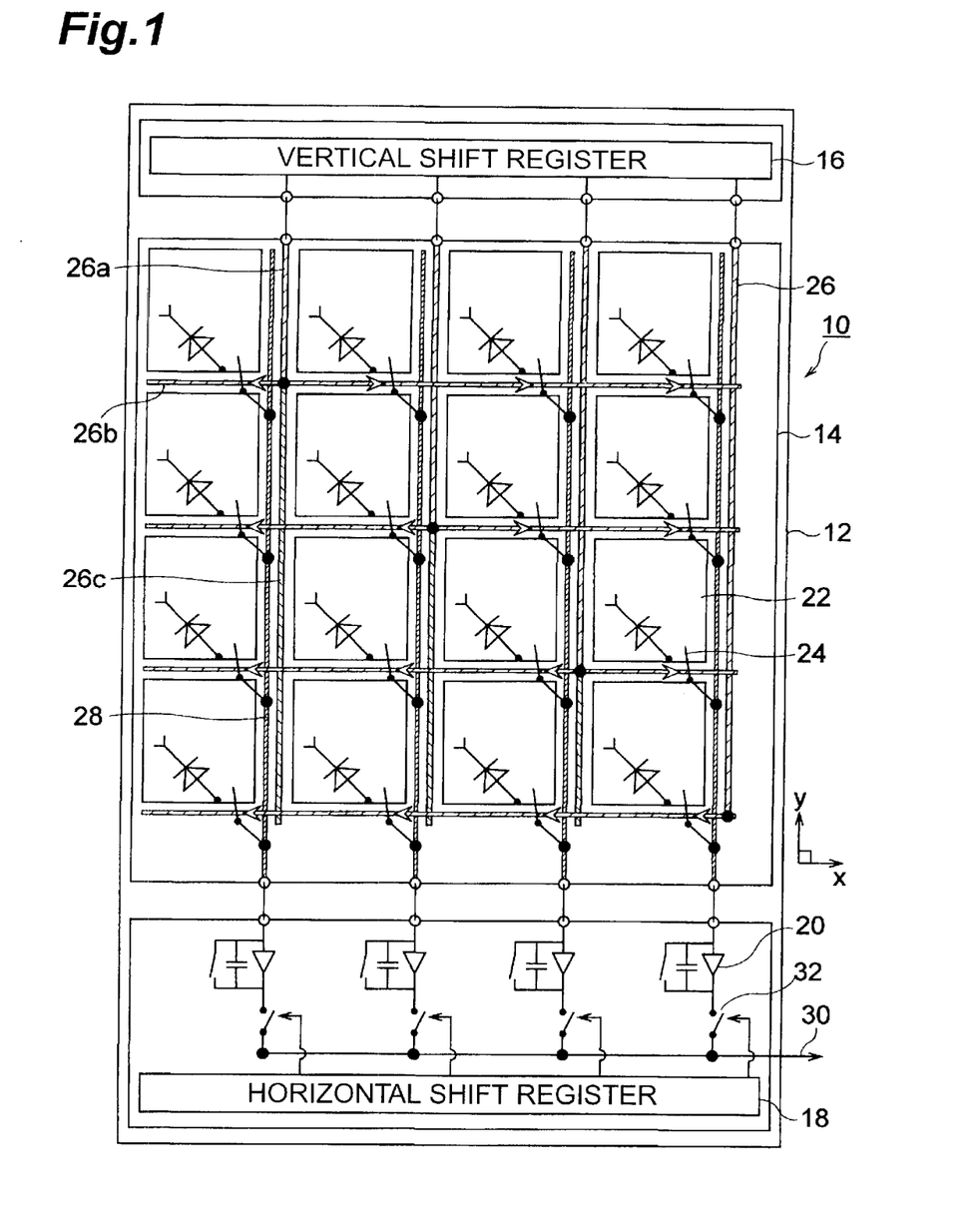
FIG. 1 is a diagram showing the arrangement of a solid-state image sensing device according to the first embodiment.

A solid-state image sensing device according to the first embodiment of the present invention will be described with reference to FIG. 1. First, the arrangement of the solid-state image sensing device according to this embodiment will be explained. FIG. 1 is a diagram showing the arrangement of the solid-state image sensing device according to the first embodiment. For descriptive convenience, the right-to-left direction in FIG. 1 will be referred to as an x-axis direction (positive toward right); and the top-to-bottom direction, as a y-axis direction (positive toward top).

In a solid-state image sensing device 10 according to the first embodiment, as shown in FIG. 1, a light-receiving portion 14, vertical shift register 16, horizontal shift register 18, and charge amplifiers (amplifier portions) 20 are formed on a substrate 12. They will be described in detail.

The light-receiving portion 14 is constituted by arraying on the substrate 12 a plurality of photodiodes (photoelectric converters) 22 for accumulating a charge amount corresponding to the light incident intensity. More specifically, the light-receiving portion 14 is made up of M×N photodiodes 22 arrayed in M rows in the y-axis direction and N columns in the x-axis direction (M and N are natural numbers).

Each photodiode 22 constituting the light-receiving portion 14 has a gate switch (switch forming the first switch group) 24 having one terminal connected to the photodiode 22 and the other terminal connected to a signal readout line (to be described later). When the gate switch 24 is open, charges by optical absorption are accumulated in the photodiode 22. If the gate switch 24 is closed, charges accumulated in the photodiode 22 are read out to the signal readout line (to be described later).

The vertical shift register 16 is formed on the substrate 12 on the upper side of the light-receiving portion 14 in the y-axis direction. The vertical shift register 16 outputs a vertical scanning signal for opening/closing the gate switch 24.

The control terminal of each gate switch 24 and the vertical shift register 16 are connected by a corresponding gate line (second wiring line) 26. This allows opening/closing the gate switch 24 by a vertical scanning signal output from the vertical shift register 16. The gate lines 26 include, specifically, N vertical lines 26a which extend from the vertical shift register 16 in the y-axis direction between the columns of the photodiodes 22 arrayed on the light-receiving portion 14, and N horizontal lines 26b which are respectively connected to the vertical lines 26a, and extend in the x-axis direction between the rows of the photodiodes 22 arrayed on the light-receiving portion 14. Each horizontal line 26b is connected to the control terminals of gate switches 24 existing on the same row. Therefore, the vertical shift register 16 and the control terminals of the gate switches 24 are connected in units of rows. Further, the vertical lines 26a of the gate lines 26 have compensation lines (compensation wiring lines) 26c so as to make almost equal the capacitances of the gate lines 26 connected in units of rows, more specifically, make the lengths of the vertical lines 26a of the gate lines 26 equal. That is, the lengths of the horizontal lines 26b are equal to each other, whereas the lengths of the vertical lines 26a including the compensation lines 26c are also equal to each other.

M signal readout lines (first wiring lines) 28 each connected to the other terminals of the gate switches 24 in units of columns are formed between the columns of the photodiodes 22 arrayed on the light-receiving portion 14. The M signal readout lines 28 are connected to a signal output line 30 via the charge amplifiers (amplifier portions) 20 each formed on a corresponding signal readout line 28 to amplify charge amounts read out to the signal readout line 28, and readout switches (switches forming the second switch group) 32 each formed on a corresponding signal readout line 28 to output charges read out from the photodiode 22 to the signal output line 30. Each charge amplifier 20 is formed on the lower side of the light-receiving portion 14 in the y-axis direction.

The horizontal shift register 18 is formed on the substrate 12 on the lower side of the light-receiving portion 14 in the y-axis direction. Thus, the vertical and horizontal shift registers 16 and 18 are respectively formed on two facing sides of the light-receiving portion 14. Since both the charge amplifiers 20 and horizontal shift register 18 are formed on the lower side of the light-receiving portion 14 in the y-axis direction, the charge amplifiers 20 are formed on, of the sides of the light-receiving portion 14, the side on which the horizontal shift register 18 is formed. The horizontal shift register 18 outputs a horizontal scanning signal for opening/closing the readout switch 32.

The function of the solid-state image sensing device according to the first embodiment will be described. In the solid-state image sensing device 10 according to this embodiment, the vertical and horizontal shift registers 16 and 18 are formed on the substrate 12 having the light-receiving portion 14. For this reason, the solid-state image sensing device itself can be easily manufactured, compared to a case in which vertical and horizontal shift registers are formed on a surface different from the surface on which the light-receiving portion is formed. Since the vertical and horizontal shift registers 16 and 18 and the light-receiving portion 14 are formed on the single substrate 12, a plurality of solid-state image sensing devices 10 can be easily arrayed without paying any special attention.

In the solid-state image sensing device 10 according to this embodiment, the vertical and horizontal shift registers 16 and 18 are formed on two facing sides (two sides facing in the y-axis direction) of the light-receiving portion 14. On the two remaining sides of the light-receiving portion 14, no element and the like are formed. On the two remaining sides (x-axis direction), therefore, any number of solid-state image sensing devices 10 can be arrayed without any dead zone.

Further, the solid-state image sensing device 10 according to this embodiment adopts the compensation lines 26c for making the lengths of the vertical lines 26a of the gate lines 26 almost equal so as to make almost equal the capacitances of the gate lines 26 connected in units of rows. Thus, the capacitances of the gate lines 26 connected in units of rows can be made almost equal, and the resistances of the gate lines 26 connected in units of rows can also be made almost equal.

The solid-state image sensing device 10 according to this embodiment comprises the charge amplifier 20 to effectively amplify a charge amount read out to the signal readout line 28. The charge amplifiers 20 are formed on, of the sides of the light-receiving portion 14, the side on which the horizontal shift register 18 is formed. This allows arraying any number of solid-state image sensing devices 10 in the x-axis direction without any dead zone regardless of the presence of the charge amplifier.

The effects of the solid-state image sensing device according to the first embodiment will be explained. The solid-state image sensing device 10 according to this embodiment can be easily manufactured and arrayed because the vertical and horizontal shift registers 16 and 18 and the light-receiving portion 14 are formed on the single substrate 12. As a result, the light-receiving area can be easily increased.

In the solid-state image sensing device 10 according to this embodiment, the vertical and horizontal shift registers 16 and 18 are arranged on two facing sides of the light-receiving portion 14. Any number of solid-state image sensing devices 10 can be arrayed in a specific direction (x-axis direction) without any dead zone. Thus, the light-receiving area can be easily increased.

Moreover, the solid-state image sensing device 10 according to this embodiment can use the compensation lines 26c to make almost equal the capacitances of the gate lines 26 connected in units of rows and make almost equal the resistances of the gate lines 26 connected in units of rows. If the lengths of gate lines connected in units of rows to the photodiodes 22 constituting the light-receiving portion 14 vary, the capacitances or resistances of the gate lines also vary. The difference between the capacitances or resistances of the gate lines (particularly the difference between the capacitances) affects the transmission characteristic of the vertical scanning signal to vary output signals from the photodiodes 22, resulting in a nonuniform image. However, the solid-state image sensing device 10 according to this embodiment can make almost equal the capacitances and resistances of the gate lines 26 connected in units of rows, and thus can prevent generation of a nonuniform image. Making the lengths of the vertical lines 26a of the gate lines 26 equal to each other can prevent the coexistence of a portion where the vertical line 26a is formed and a portion where no vertical line 26a is formed between the columns of the photodiodes 22 arrayed on the light-receiving portion 14. As a result, the opening areas of the photodiodes 22 can be made equal, and generation of a nonuniform image by the difference in opening area can also be prevented.

Figure 2:
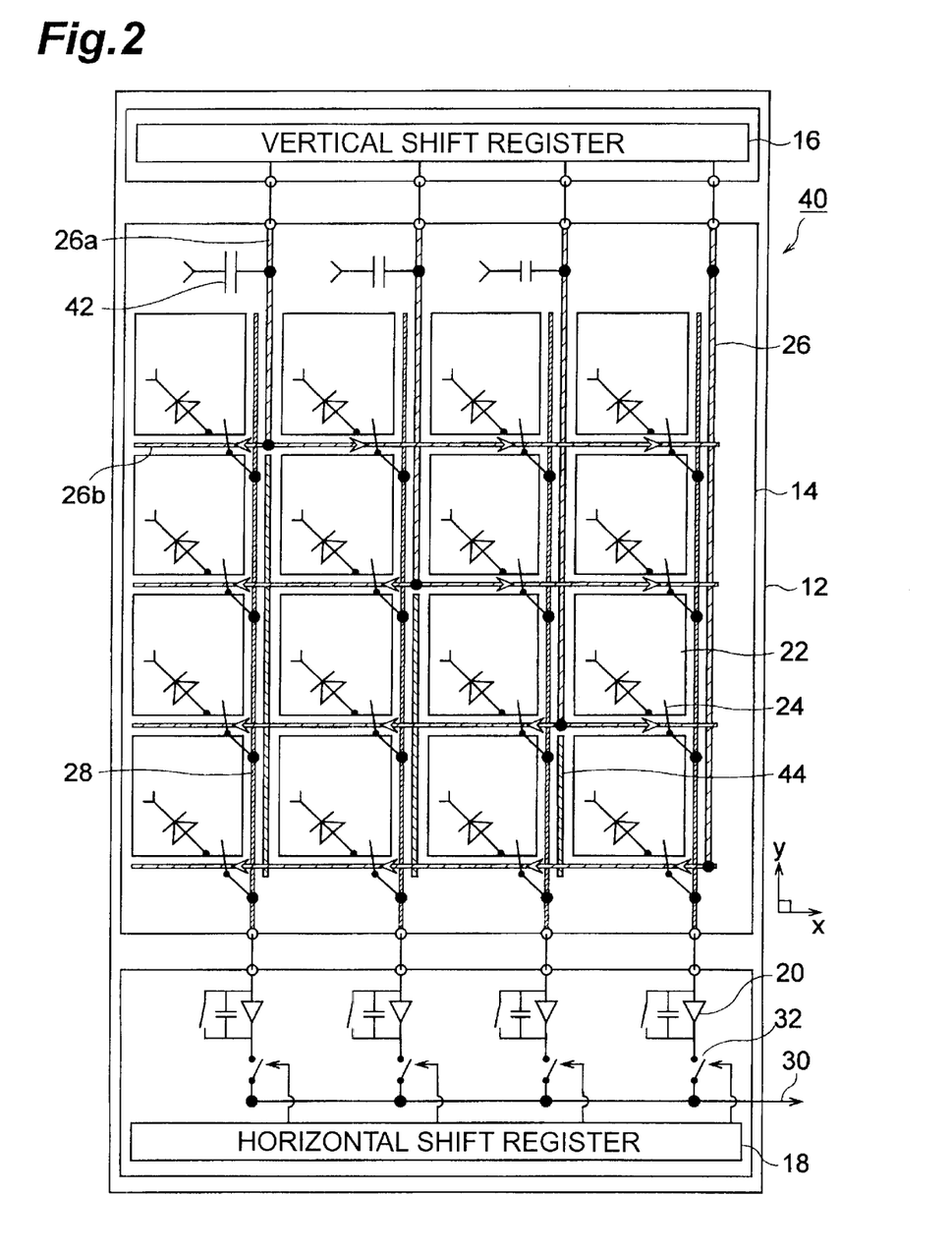
FIG. 2 is a diagram showing the arrangement of a solid-state image sensing device according to the second embodiment.

A solid-state image sensing device according to the second embodiment of the present invention will be described with reference to FIG. 2. FIG. 2 is a diagram showing the arrangement of the solid-state image sensing device according to this embodiment. A solid-state image sensing device 40 according to the second embodiment is different from the solid-state image sensing device 10 according to the first embodiment in the following point. That is, in the solid-state image sensing device 10 according to the first embodiment, the compensation lines 26c for making the lengths of the vertical lines 26a of the gate lines 26 equal are formed to make almost equal the capacitances of the gate lines 26 connected in units of rows. To the contrary, in the solid-state image sensing device 40 according to the second embodiment, capacitors 42 are connected to respective vertical lines 26a of gate lines 26 so as to make almost equal the capacitances of the gate lines 26 connected in units of rows. As the length of the vertical line 26a of each gate line 26 becomes shorter, the capacitance of the capacitor 42 connected to the vertical line 26a becomes larger.

A light-shielding line 44 of polysilicon or aluminum having almost the same width as that of the vertical line 26a is formed at a portion where no vertical line 26a is formed in the extending direction of the vertical line 26a between the columns of photodiodes 22 arrayed on a light-receiving portion 14. Since the light-shielding line 44 having almost the same width as that of the vertical line 26a is formed at a portion where no vertical line 26a is formed, the opening areas of the photodiodes 22 can be made equal even if both a portion where the vertical line 26a is formed and a portion where no vertical line 26a is formed exist between the columns of the photodiodes 22 arrayed on the light-receiving portion 14. Thus, generation of a nonuniform image by the difference in opening area can also be prevented.

In the solid-state image sensing device 40 according to this embodiment, as in the solid-state image sensing device 10 according to the first embodiment, the light-receiving area can be easily increased without any dead zone.

The solid-state image sensing device 40 according to this embodiment uses the capacitors 42 to make almost equal the capacitances of the gate lines 26 connected in units of rows. Therefore, the capacitances of the gate lines 26 connected in units of rows can be easily made almost equal, compared to a case in which the compensation lines 26c are formed. The resistances of the gate lines 26 cannot be strictly made equal, compared to a case in which the compensation lines 26c are formed. However, mainly the difference between the capacitances of the gate lines affects the transmission characteristic of the vertical scanning signal to generate a nonuniform image. Considering this, generation of a nonuniform image can be easily and effectively prevented using the capacitors 42.

Figure 3:
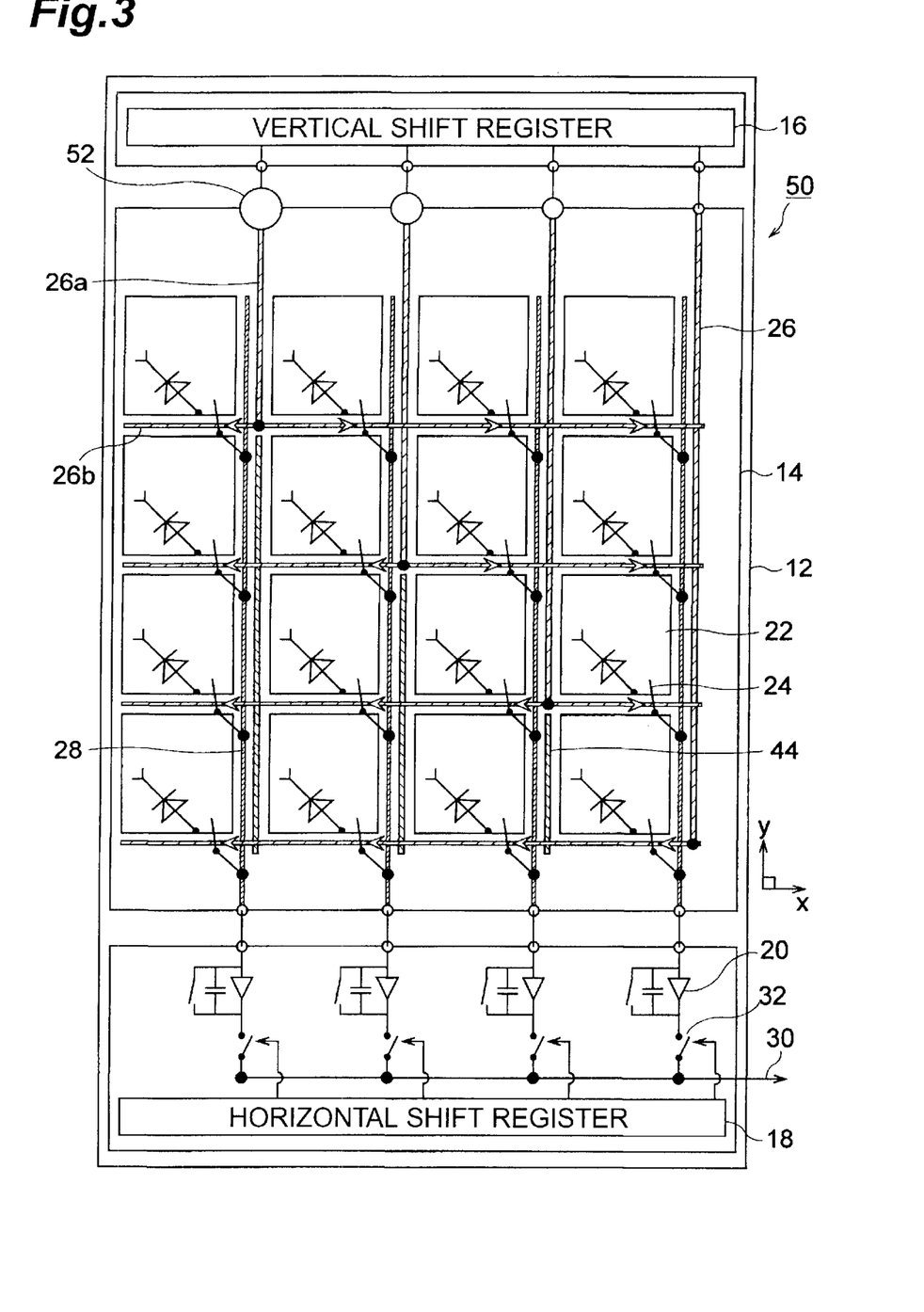
FIG. 3 is a diagram showing the arrangement of a solid-state image sensing device according to the third embodiment.

A solid-state image sensing device according to the third embodiment of the present invention will be described with reference to FIG. 3. FIG. 3 is a diagram showing the arrangement of the solid-state image sensing device according to this embodiment. A solid-state image sensing device 50 according to the third embodiment is different from the solid-state image sensing device 10 according to the first embodiment in the following point. That is, in the solid-state image sensing device 10 according to the first embodiment, the compensation lines 26c for making the lengths of the vertical lines 26a of the gate lines 26 equal are formed to make almost equal the capacitances of the gate lines 26 connected in units of rows. To the contrary, in the solid-state image sensing device 50 according to the third embodiment, conductive pads 52 are formed on vertical lines 26a of gate lines 26 so as to make almost equal the capacitances of the gate lines 26 connected in units of rows. As the length of the vertical line 26a of each gate line 26 becomes shorter, the area of the conductive pad 52 formed on the vertical line 26a becomes larger. The conductive pad 52 functions as a capacitor in cooperation with a substrate 12 and another conductive portion. For a larger area, the capacitance increases.

Further, similar to the solid-state image sensing device 40 according to the second embodiment, a light-shielding line 44 is formed at a portion where no vertical line 26a is formed in the extending direction of the vertical line 26a between the columns of photodiodes 22 arrayed on a light-receiving portion 14. The light-shielding line 44 prevents generation of a nonuniform image owing to the difference in opening area.

In the solid-state image sensing device 50 according to this embodiment, as in the solid-state image sensing device 10 according to the first embodiment, the light-receiving area can be easily increased without any dead zone.

In the solid-state image sensing device 50 according to this embodiment, as in the solid-state image sensing device 40 according to the second embodiment, the resistances of the gate lines 26 cannot be strictly made equal. However, mainly the difference between the capacitances of the gate lines affects the transmission characteristic of the vertical scanning signal to generate a nonuniform image. Considering this, generation of a nonuniform image can be easily and effectively prevented using the conductive pads 52.

Figure 4:
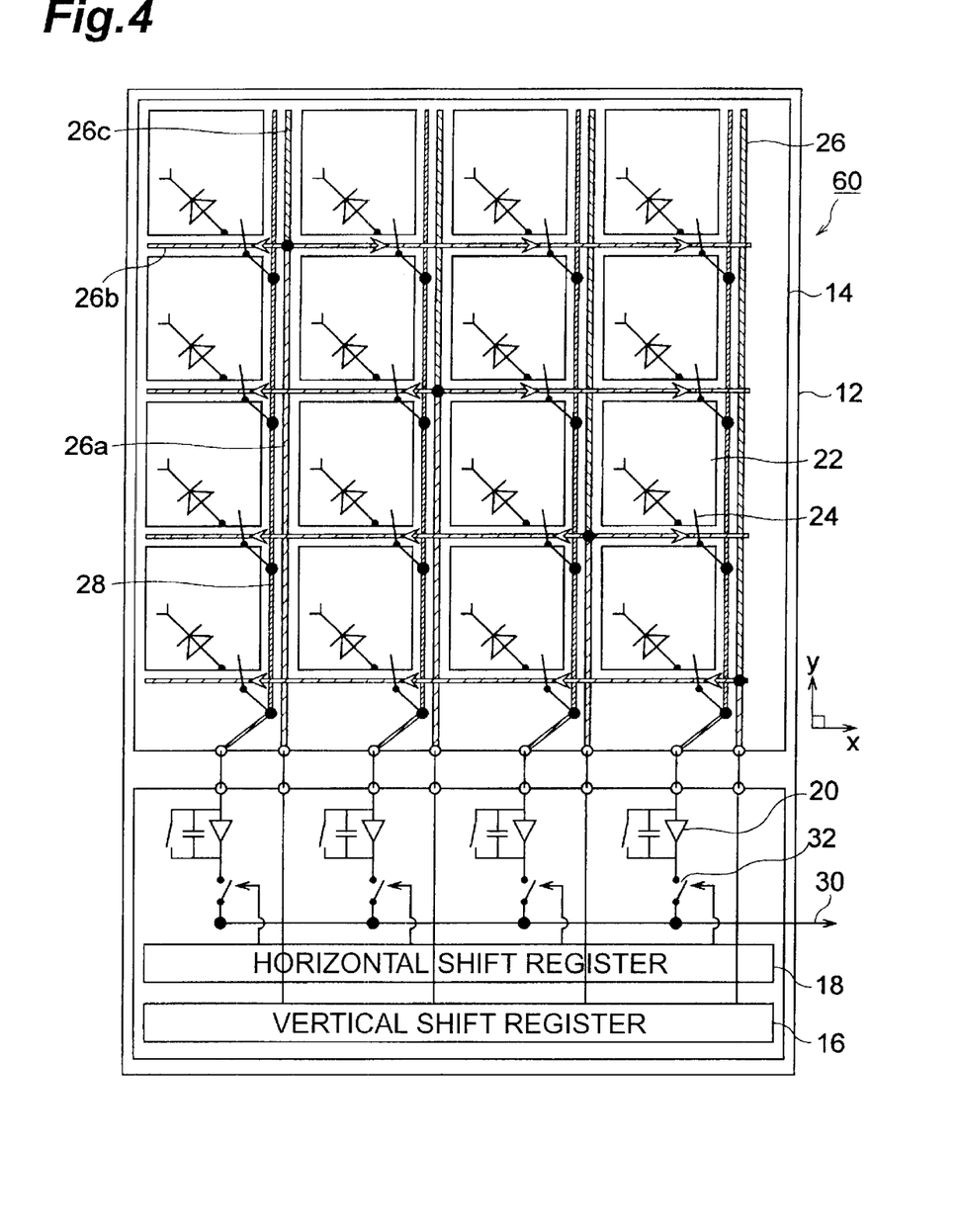
FIG. 4 is a diagram showing the arrangement of a solid-state image sensing device according to the fourth embodiment.

A solid-state image sensing device according to the fourth embodiment of the present invention will be described with reference to FIG. 4. FIG. 4 is a diagram showing the arrangement of the solid-state image sensing device according to this embodiment. A solid-state image sensing device 60 according to the fourth embodiment is different from the solid-state image sensing device 10 according to the first embodiment in the following point. That is, in the solid-state image sensing device 10 according to the first embodiment, the vertical and horizontal shift registers 16 and 18 are respectively formed on two facing sides of the light-receiving portion 14. To the contrary, in the solid-state image sensing device 60 according to the fourth embodiment, both vertical and horizontal shift registers 16 and 18 are formed on a predetermined side (lower side in the y-axis direction) of a light-receiving portion 14.

In the solid-state image sensing device 60 according to this embodiment, as in the solid-state image sensing device 10 according to the first embodiment, the light-receiving area can be easily increased without any dead zone. When the solid-state image sensing device 60 according to this embodiment is adopted, solid-state image sensing devices 60 can be further arrayed without any dead zone, on a side (upper side in the y-axis direction) facing the side on which the vertical and horizontal shift registers 16 and 18 are formed. Thus, the light-receiving area can be further increased.

In the solid-state image sensing device 60 according to this embodiment, both the vertical and horizontal shift registers 16 and 18, which are arranged on one side of the light-receiving portion 14, can be formed into one CMOS element. Accordingly, the vertical and horizontal shift registers 16 and 18 can be easily formed.

By using a solid-state image sensing device according to each embodiment, a solid-state image sensing device array free from any dead zone can be formed by arraying such solid-state image sensing devices on a predetermined side, as described above.

More specifically, in the solid-state image sensing device 10, 40, or 50 of the first, second, or third embodiment, the vertical and horizontal shift registers 16 and 18 are respectively arranged on two facing sides (upper and lower sides in they-axis direction) of the light-receiving portion 14. Such solid-state image sensing devices adjacent to each other along either one of the two sides of each device in the x-axis direction can be formed into a solid-state image sensing device array free from any dead zone between the devices.

In the solid-state image sensing device 60 according to the fourth embodiment, both the vertical and horizontal shift registers 16 and 18 are arranged on one side (lower side in the y-axis direction) of the light-receiving portion 14. Such solid-state image sensing devices adjacent to each other along any one of two sides in the x-axis direction and an upper side in the y-axis direction can be formed into a solid-state image sensing device array free from any dead zone between the devices.

Figure 5:
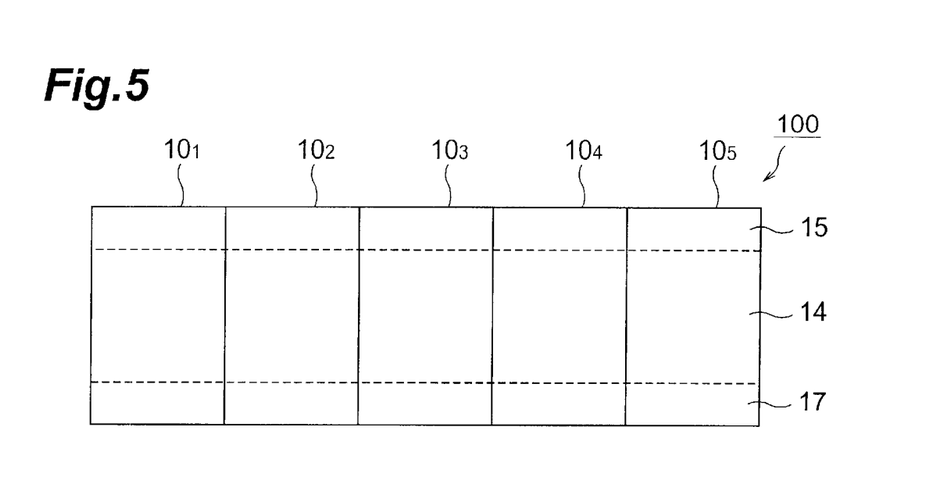
FIG. 5 is a view showing an example of a solid-state image sensing device array formed using the solid-state image sensing device shown in FIG. 1.

FIG. 5 is a view showing an example of a solid-state image sensing device array formed using the solid-state image sensing device 10 shown in FIG. 1. A solid-state image sensing device array 100 uses five solid-state image sensing devices 10$_1$ to 10$_5$ in each of which a vertical shift register portion 15 including a vertical shift register 16 and a horizontal shift register portion 17 including a horizontal shift register 18 are respectively formed on two facing sides of a light-receiving portion 14.

The vertical shift register portion 15 is set as an upper side in FIG. 5, and the horizontal shift register portion 17 is set as a lower side. An array is formed by sequentially arranging the solid-state image sensing devices 10$_1$ to 10$_5$ from left to right along sides perpendicular to the upper and lower sides that serve as sides between adjacent solid-state image sensing devices. This realizes the solid-state image sensing device array 100 free from any dead zone between the solid-state image sensing devices 10$_1$ to 10$_5$ aligned in a lateral direction. Note that a solid-state image sensing device array having the same arrangement can also be formed using the solid-state image sensing device 40 or 50 shown in FIG. 2 or 3.

Figure 6:
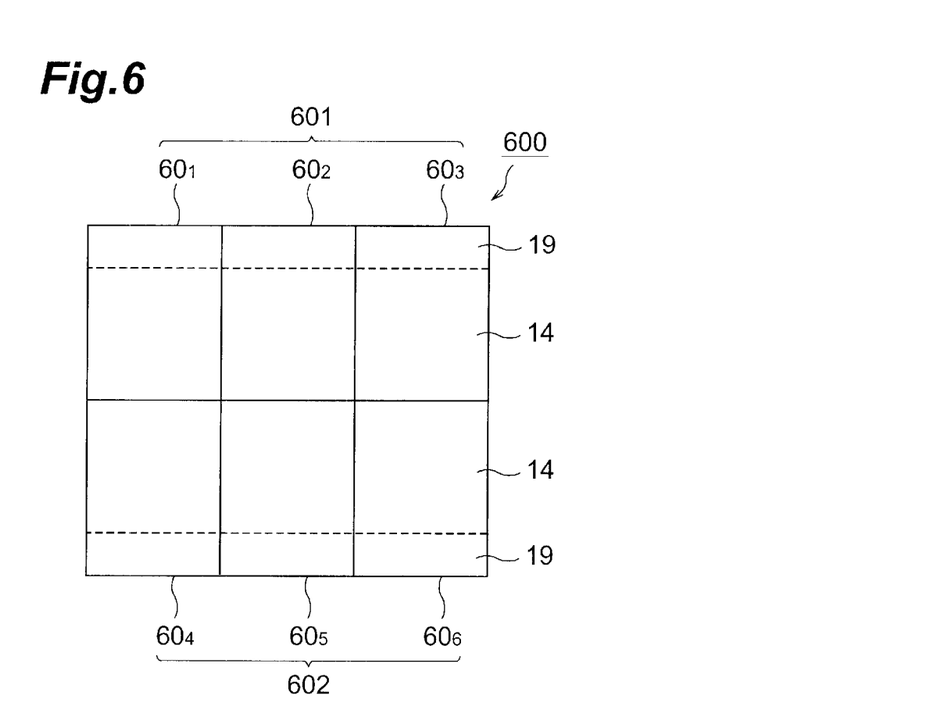
FIG. 6 is a view showing an example of a solid-state image sensing device array formed using the solid-state image sensing device shown in FIG. 4.

FIG. 6 is a view showing an example of a solid-state image sensing device array formed using the solid-state image sensing device 60 shown in FIG. 4. A solid-state image sensing device array 600 uses six solid-state image sensing devices 60$_1$ to 60$_6$ in each of which a shift register portion 19 including vertical and horizontal shift registers 16 and 18 is formed on one side of a light-receiving portion 14.

The shift register portion 19 is set as an upper side in FIG. 5, and an upper array 601 is formed by sequentially arranging the solid-state image sensing devices 60$_1$ to 60$_3$ from left to right along sides perpendicular to the upper side that serve as sides between adjacent solid-state image sensing devices. On the other hand, the shift register portion 19 is set as a lower side in FIG. 5, and a lower array 602 is formed by sequentially arranging the solid-state image sensing devices 60$_4$ to 60$_6$ from left to right along sides perpendicular the lower side that serve as sides between adjacent solid-state image sensing devices. Then, the lower side of the upper array 601 opposite to the shift register portion 19, and the upper side of the lower array 602 opposite to the shift register portion 19 are arranged in contact with each other. This realizes the solid-state image sensing device array 600 free from any dead zone among the solid-state image sensing devices 60$_1$ to 60$_6$ arrayed in two lateral lines.

The number of devices arrayed in the lateral direction (x-axis direction) is not limited in the solid-state image sensing device array of one or two lateral lines shown in FIG. 5 or 6. Any number of devices can be arrayed without any dead zone.

The solid-state image sensing device 60 having vertical and horizontal shift registers formed on the same side can employ various array shapes. For example, a light-receiving region of a special shape may be required in the medical field or the like. The solid-state image sensing device can be applied to such shape.

Figure 7:
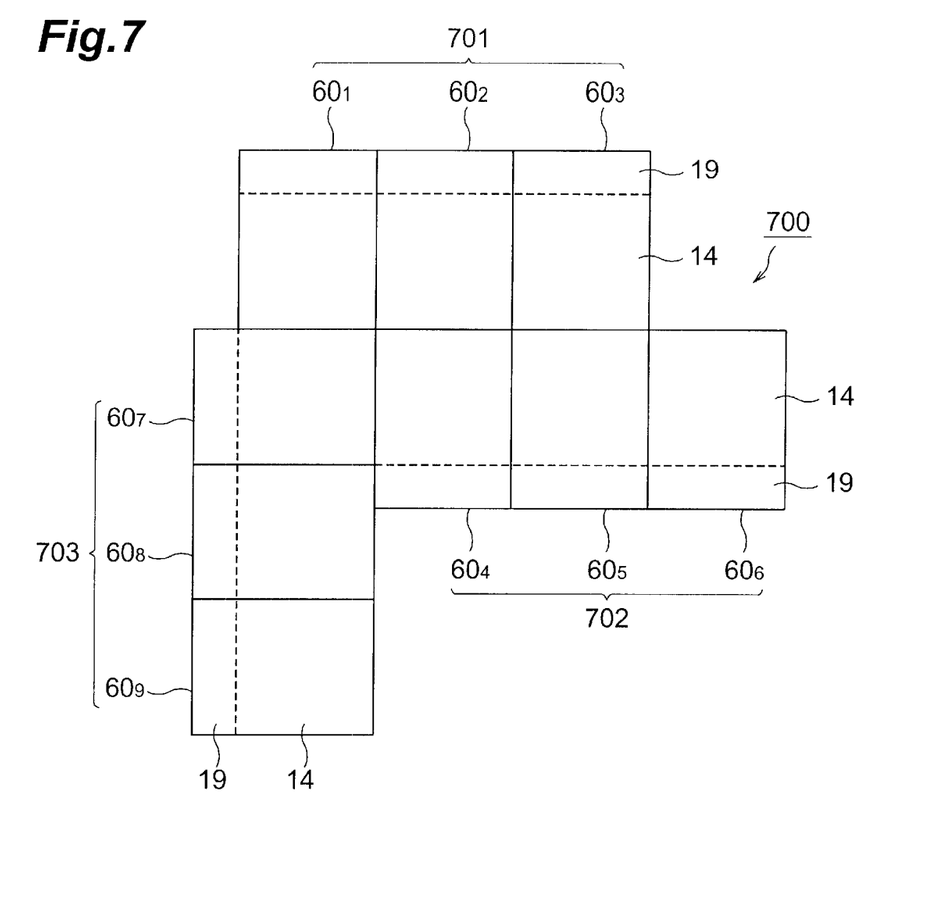
FIG. 7 is a view showing another example of the solid-state image sensing device array formed using the solid-state image sensing device shown in FIG. 4.

FIG. 7 is a view showing another example of the solid-state image sensing device array formed using the solid-state image sensing device 60 shown in FIG. 4. A solid-state image sensing device array 700 uses nine solid-state image sensing devices $60_1$ to $60_9$. Similar to the arrays 601 and 602 of the solid-state image sensing device array 600 shown in FIG. 6, a first array 701 is formed from the solid-state image sensing devices $60_1$ to $60_3$; a second array 702, from the solid-state image sensing devices $60_4$ to $60_6$; and a third array 703, from the solid-state image sensing devices $60_7$ to $60_9$.

The shift register portion 19 of the first array 701 is set as an upper side in FIG. 7, and the shift register portion 19 of the second array 702 is set as a lower side. The lower sides of the solid-state image sensing devices $60_2$ and $60_3$ opposite to the shift register portion 19 are arranged in contact with the upper sides of the solid-state image sensing devices $60_4$ and $60_5$ opposite to the shift register portion 19. In addition, the shift register portion 19 of the third array 703 is set as a left side in FIG. 7. The upper and right sides of the upper solid-state image sensing device $60_7$ perpendicular to and opposite to the shift register portion 19 are arranged in contact with the lower side of the solid-state image sensing device $60_1$ and the left side of the solid-state image sensing device $60_4$, respectively. This can also realize the solid-state image sensing device array 700 free from any dead zone between the solid-state image sensing devices $60_1$ to $60_9$.

The present invention can be applied as a solid-state image sensing device capable of attaining a large light-receiving area without any dead zone as an insensible region. Since the vertical and horizontal shift registers are arranged on two facing sides or a predetermined side of a light-receiving portion, the solid-state image sensing device can be easily manufactured and arrayed. Consequently, the light-receiving area can be easily increased, and any number of solid-state image sensing devices can be arrayed without any dead zone.

In the solid-state image sensing device of the present invention, the second wiring lines have the compensation portions for making the capacitances of the second wiring lines almost equal in units of rows. The compensation portions can compensate for the difference between capacitances by the difference between the lengths of the second wiring lines in units of rows. As a result, generation of a nonuniform image by the capacitance difference can be prevented.

What is claimed is:

1. A solid-state image sensing device comprising:

a light-receiving portion having a plurality of photoelectric converters arrayed in M rows and N columns on a substrate;

first wiring lines formed in units of columns;

a first switch group including a plurality of switches for connecting the photoelectric converters to said first wiring lines in units of columns;

a vertical shift register for outputting a vertical scanning signal for opening/closing the switches forming said first switch group in units of rows;

second wiring lines for connecting control terminals of the switches forming said first switch group to said vertical shift register in units of rows, said second wiring lines having compensation portions for making capacitances of said second wiring lines almost equal in units of rows;

a second switch group including a plurality of switches for connecting said first wiring lines to a signal output line; and a horizontal shift register for outputting a horizontal scanning signal for opening/closing the switches forming said second switch group in units of columns, wherein said vertical and horizontal shift registers are arranged on a predetermined side of said light-receiving portion, and charge amplifier portions are formed on the predetermined side of the light-receiving portion on which said horizontal and vertical shift registers are arranged on said substrate, for amplifying charge amounts read out of said first wiring lines, each of said charge amplifier portions being formed corresponding to each of the N columns and located within an area defined by the width of each of the N columns.

2. A solid-state image sensing device according to claim 1, characterized in that the compensation portions are capacitors connected to said second wiring lines in units of rows.

3. A solid-state image sensing device according to claim 1, characterized in that the compensation portions are conductive pads formed on said second wiring lines in units of rows.

4. A solid-state image sensing device according to claim 1, characterized in that the compensation portions are compensation lines formed on said second wiring lines in units of rows so as to make lengths of said second wiring lines equal in units of rows.

5. A solid-state image sensing device array formed by arraying a plurality of solid-state image sensing devices defined in claim 1, characterized in that as for two solid-state image sensing devices adjacent to each other, said two solid-state image sensing devices are arranged adjacent to each other such that, of four sides of said light-receiving portion of one solid-state image sensing device, any one of two sides or one side perpendicular to or facing a side on which said vertical and horizontal shift register is formed is in contact with, of four sides of said light-receiving portion of the other solid-state image sensing device, any one of two sides or one side perpendicular to or facing a side on which said vertical and horizontal shift register is formed.

* * * * *